United States Patent
Suzuki et al.

(10) Patent No.: US 8,036,324 B2
(45) Date of Patent: Oct. 11, 2011

(54) DIGITAL BROADCASTING RECEIVING APPARATUS

(75) Inventors: Satoshi Suzuki, Tokyo (JP); Mitsuru Takeuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 90 days.

(21) Appl. No.: 12/530,895

(22) PCT Filed: Mar. 4, 2008

(86) PCT No.: PCT/JP2008/000439
§ 371 (c)(1),
(2), (4) Date: Sep. 11, 2009

(87) PCT Pub. No.: WO2008/146431
PCT Pub. Date: Dec. 4, 2008

(65) Prior Publication Data
US 2010/0091917 A1 Apr. 15, 2010

(30) Foreign Application Priority Data
May 30, 2007 (JP) ................. 2007-144008

(51) Int. Cl.
*H04L 27/08* (2006.01)
(52) U.S. Cl. ........ 375/345; 375/347; 375/316; 375/371; 455/334; 455/232.1; 455/233.1; 370/208; 370/445
(58) Field of Classification Search .......... 375/345, 375/260, 316, 371, 347; 370/210, 208, 445; 714/704; 455/334, 232.1, 233.1
See application file for complete search history.

(56) References Cited

U.S. PATENT DOCUMENTS

| 5,694,389 A | * | 12/1997 | Seki et al. ............ 370/208 |
| 5,898,699 A | * | 4/1999 | Chiba ............ 714/704 |
| 6,038,275 A | * | 3/2000 | Taura et al. ............ 375/371 |
| 6,788,747 B1 | * | 9/2004 | Okanobu ............ 375/316 |
| 7,051,355 B1 | * | 5/2006 | Inose et al. ............ 725/71 |
| 7,356,094 B1 | * | 4/2008 | Ikeda et al. ............ 375/316 |
| 2002/0126780 A1 | * | 9/2002 | Oshima et al. ............ 375/347 |
| 2003/0026364 A1 | * | 2/2003 | Adachi ............ 375/345 |
| 2003/0204858 A1 | * | 10/2003 | Nakamura ............ 725/151 |

FOREIGN PATENT DOCUMENTS

| JP | 2002-359569 A | 12/2002 |
| JP | 2003-69907 A | 3/2003 |
| JP | 2003-234975 A | 8/2003 |
| JP | 2003-234977 A | 8/2003 |
| JP | 3538056 B2 | 3/2004 |
| JP | 2005-5819 A | 1/2005 |
| JP | 2006-13689 A | 1/2006 |
| JP | 2006-24994 A | 1/2006 |
| JP | 2006-115204 A | 4/2006 |
| JP | 2006-352488 A | 12/2006 |
| JP | 2006-352674 A | 12/2006 |

* cited by examiner

*Primary Examiner* — Eva Puente
(74) *Attorney, Agent, or Firm* — Birch, Stewart, Kolasch & Birch, LLP

(57) ABSTRACT

A digital broadcasting receiving apparatus has a signal level detecting circuit; a peak detecting section; an abnormal peak deciding section; a specified peak deciding section; a prescribed in-band power deciding section; and makes a decision as to whether a signal being received is a digital broadcasting signal or not according to decision results output form the signal level detecting circuit, the abnormal peak deciding section, the specified peak deciding section and the prescribed in-band power deciding section.

4 Claims, 5 Drawing Sheets

DIGITAL BROADCASTING RECEIVING APPARATUS

TECHNICAL FIELD

The present invention relates to a digital broadcasting receiving apparatus that reduces channel search time.

BACKGROUND ART

Digital terrestrial broadcasting makes transmission parameters such as a modulation scheme and a code rate of inner code variable using a TMCC (Transmission and Multiplexing Configuration Control) signal, thereby enabling hierarchical transmission. For this reason, a conventional digital broadcasting receiving apparatus makes a decision as to whether there is any receivable digital broadcasting signal in a certain frequency band depending on whether the TMCC signal is present or not. However, to decide as to whether the TMCC signal is present or not, a problem arises of taking a time to make the decision because of the necessity for establishing synchronization of the TMCC signal.

To solve the foregoing problem, a conventional digital broadcasting receiving apparatus is known which has a signal level detecting means for making a decision as to whether the signal level of the data output from a data demodulation means for demodulating a received signal is smaller than a predetermined threshold or not, and which selects the next channel at once when the signal level of the data is less than the threshold (see Patent Document 1, for example).

In addition, a device is known which has an analog broadcasting detecting means for detecting the video carrier and audio carrier of an analog broadcasting signal, and a digital broadcasting signal detecting means for dividing the band into several bands, for calculating signal levels in the respective bands, and for making a decision as to whether the difference between the highest and lowest levels among the calculated signal levels is within a prescribed range; and which decides the received signal with the analog broadcasting detecting means, selects the next channel at once when the signal is an analog broadcasting signal, and decides, when the signal is not an analog broadcasting signal, the signal with the digital broadcasting signal detecting means (see Patent Document 2, for example).

Furthermore, another device is known which has the signal level detecting circuit described in Patent Document 1, the analog broadcasting detecting means and the digital broadcasting detecting means described in Patent Document 2, and which causes the analog broadcasting detecting means, signal level detecting means and digital broadcasting detecting means to make a decision as to the received signal in this order (see Patent Document 3, for example).

Patent Document 1: Japanese Patent No. 3538056.
Patent Document 2: Japanese Patent Laid-Open No. 2003-69907.
Patent Document 3: Japanese Patent Laid-Open No. 2006-24994.

The conventional digital broadcasting receiving apparatuses are configured as described above. As for the apparatus described in Patent Document 1, since the analog broadcasting signal has certain power, it makes a decision as to whether the TMCC signal is present about the analog broadcasting signal as well. For this reason, it has a problem of being unable to reduce the search time so much. In addition, as for the apparatus described in Patent Document 2 or 3, since it requires a dedicated tuner for detecting the analog broadcasting signal, it has a problem of becoming larger. Furthermore, since it divides the band into several bands, calculates the signal levels in the respective bands, and makes a decision as to whether the received signal is digital broadcasting signal or not depending on whether the difference between the highest and lowest levels among the calculated signal levels is within the prescribed range, a problem arises of erroneously detecting the noise produced by equipment used simultaneously as the digital broadcasting signal if the noise has certain power in the band.

The present invention is implemented to solve the foregoing problems. Therefore, it is an object of the present invention to provide a digital broadcasting receiving apparatus capable of carrying out search operation at high speed by distinguishing the digital broadcasting signal from the other signals accurately in a short time.

DISCLOSURE OF THE INVENTION

A digital broadcasting receiving apparatus in accordance with the present invention includes a signal level detecting circuit for making a decision as to whether an automatic gain control level of a received signal is greater than a prestored threshold or not, and for outputting the decision result; a peak detecting section for detecting a peak of a power level within a band of the signal, and for outputting the detected peak; an abnormal peak deciding section for making a decision as to whether a peak greater than a prestored threshold is present in peaks output from the peak detecting section or not, and for outputting the decision result; a specified peak deciding section for making a decision within a specified frequency band as to whether a peak exceeding a prestored threshold is present in the peaks output from the peak detecting section or not, and for outputting the decision result; and a prescribed in-band power deciding section for making a decision as to whether the sum total of all powers within a prescribed band is greater than a prestored threshold or not, and for outputting the decision result; and makes a decision as to whether a signal being received is a digital broadcasting signal or not according to the decision results output from the signal level detecting circuit, the abnormal peak deciding section, the specified peak deciding section and the prescribed in-band power deciding section.

According to the present invention, the apparatus is configured in such a manner that it includes a signal level detecting circuit for making a decision as to whether an automatic gain control level of a received signal is greater than a prestored threshold or not, and for outputting the decision result; a peak detecting section for detecting a peak of a power level within a band of the signal, and for outputting the detected peak; an abnormal peak deciding section for making a decision as to whether a peak greater than a prestored threshold is present in peaks output from the peak detecting section or not, and for outputting the decision result; a specified peak deciding section for making a decision within a specified frequency band as to whether a peak exceeding a prestored threshold is present in the peaks output from the peak detecting section or not, and for outputting the decision result; and a prescribed in-band power deciding section for making a decision as to whether the sum total of all powers within a prescribed band is greater than a prestored threshold or not, and for outputting the decision result; and makes a decision as to whether a signal being received is a digital broadcasting signal or not according to the decision results output from the signal level detecting circuit, the abnormal peak deciding section, the specified peak deciding section and the prescribed in-band power deciding section. Accordingly, it offers an advantage of being able to distinguish the digital broadcasting signal from the other signals accurately in a short time, and to carry out the search operation at high speed.

BEST MODE FOR CARRYING OUT THE INVENTION

An embodiment in accordance with the present invention will now be described with reference to the accompanying drawings.

Embodiment 1

Figure 1:
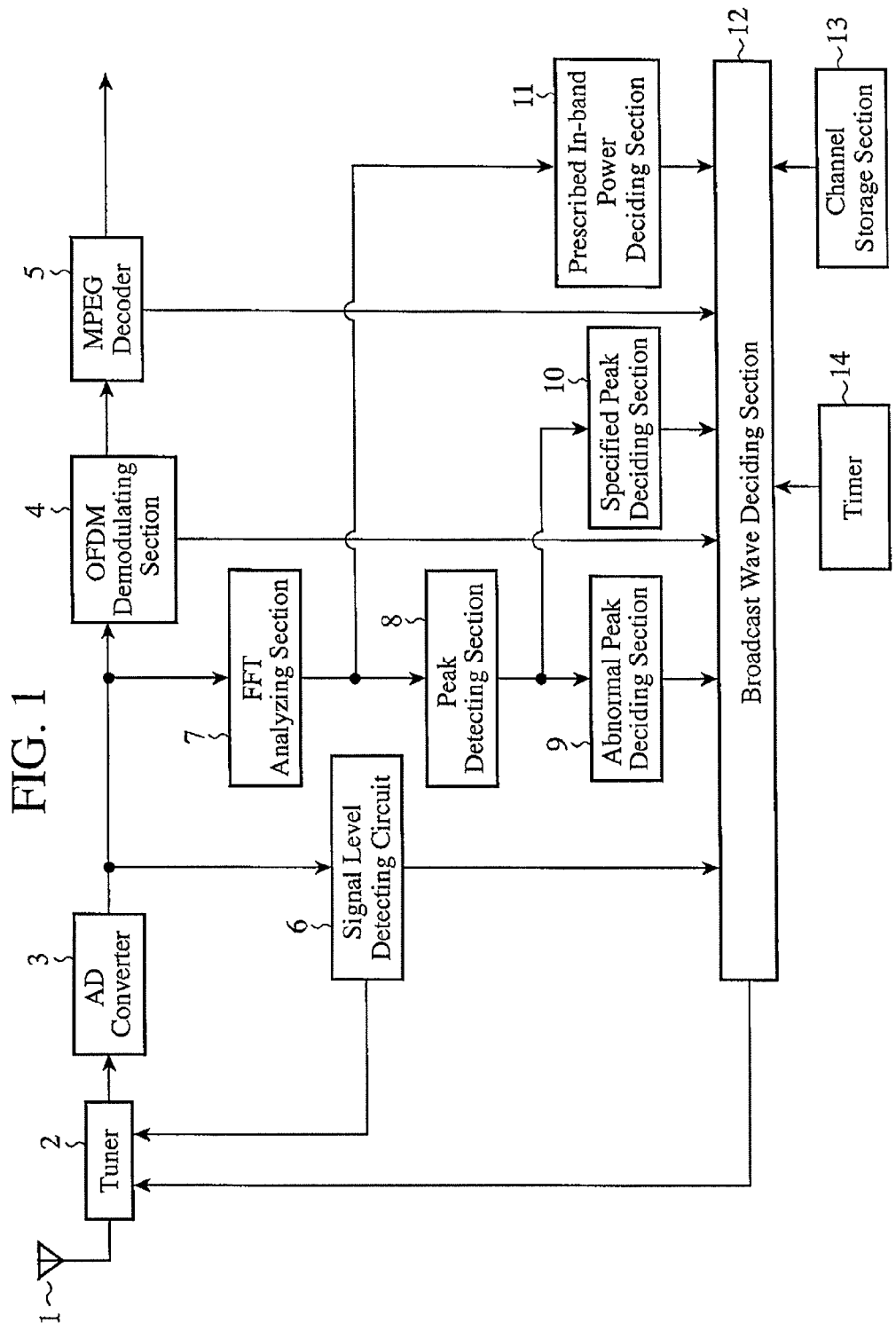
FIG. 1 is a diagram showing a configuration of a digital broadcasting receiving apparatus of an embodiment 1.

FIG. 1 is a diagram showing a configuration of a digital broadcasting receiving apparatus of the present embodiment 1. It has an antenna 1, a tuner 2, an AD (Analog/Digital) converter 3, an OFDM (Orthogonal Frequency Division Multiplexing) demodulating section 4, an MPEG (Moving Picture Experts Group) decoder 5, a signal level detecting circuit 6, an FFT (Fast Fourier Transform) analyzing section 7, a peak detecting section 8, an abnormal peak deciding section 9, a specified peak deciding section 10, an prescribed in-band power deciding section 11, a broadcast wave deciding section 12, a channel storage section 13, and a timer 14; and has a search function of performing tuning by sweeping successively from UHF (Ultra High Frequency) 13 (channel 13) to UHF 62 (channel 62) constituting the frequency bands assigned to the digital broadcasting.

The antenna 1 receives RF (radio frequency) signals, which are broadcast waves transmitted from broadcasting stations. The tuner 2 selects a desired channel (frequency band) from the RF signals the antenna 1 receives, and converts it to an IF (intermediate frequency) signal to be output. The AD converter 3 converts the IF signal output from the tuner 2 from an analog signal to a digital signal, and outputs it. The OFDM demodulating section 4 demodulates the digital signal output from the AD converter 3, and outputs an MPEG2-TS (Transport Stream) signal. In addition, the OFDM demodulating section 4 outputs an OFDM frame lock signal when the synchronization of the digital signal output from the AD converter 3 has been established. The MPEG decoder 5 decodes the MPEG2-TS signal output from the OFDM demodulating section 4, and outputs a broadcasting station name, a proper identifier (TSID) of the broadcasting station, broadcasting station information like a channel number, a video signal, an audio signal and so on.

Figure 2:
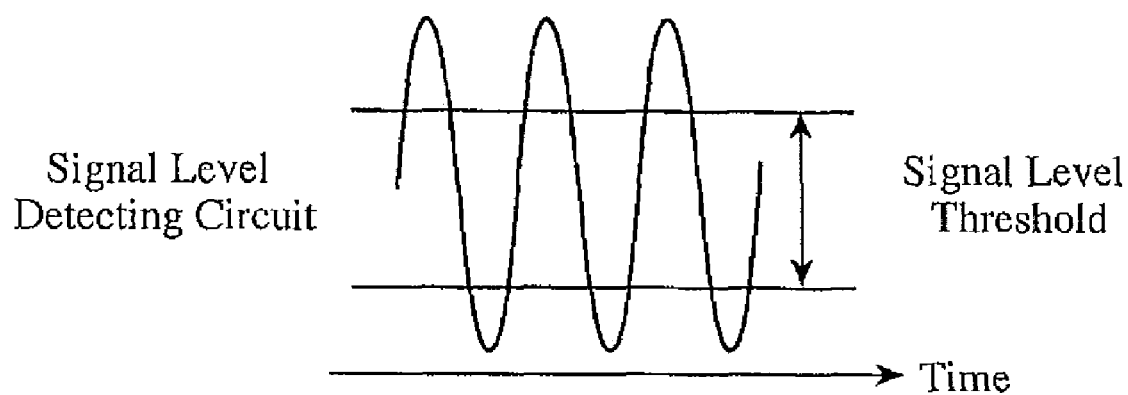
FIG. 2 is a diagram showing a decision processing method in a signal level detecting circuit.

The signal level detecting circuit 6 continuously monitors the power level of the digital signal output from the AD converter 3, and performs the gain control of the tuner 2 so as to maintain the power level of the IF signal output from the tuner 2 at a fixed level. In addition, the signal level detecting circuit 6 makes a decision as to whether the AGC (automatic gain control) level due to the gain control is greater than a prestored threshold (referred to as "signal level threshold" from now on), and outputs the decision result to the broadcast wave deciding section 12. FIG. 2 is a diagram showing a decision processing method in the signal level detecting circuit 6. When the AGC level does not fall within the signal level threshold as shown in FIG. 2, the signal level detecting circuit 6 outputs a level existence signal. In contrast, when the AGC level falls within the signal level threshold, the signal level detecting circuit 6 outputs a level nonexistence signal.

Figure 3:
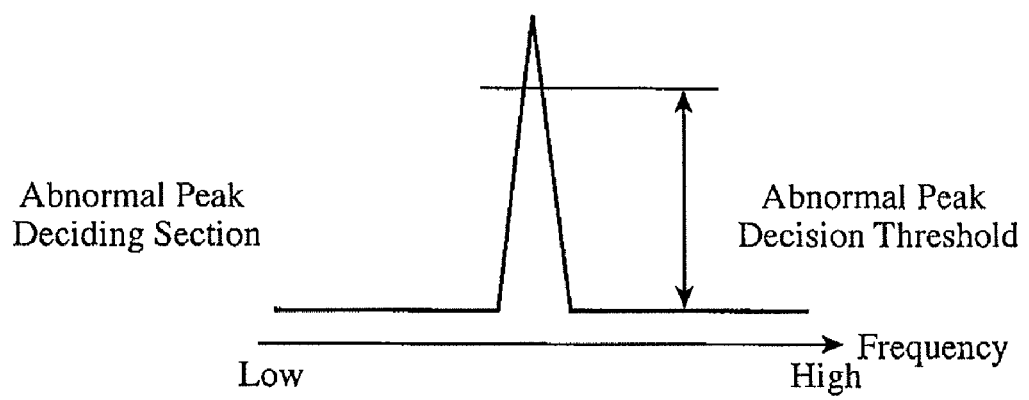
FIG. 3 is a diagram showing a decision processing method in an abnormal peak deciding section.

The FFT analyzing section 7 performs FFT processing on the digital signal output from the AD converter 3, and outputs the processing result to the peak detecting section 8 and to the prescribed in-band power deciding section 11. The peak detecting section 8 detects a peak having a power level higher than the threshold within the band by comparing the processing result with the prestored prescribed threshold, and outputs the detected peak to the abnormal peak deciding section 9 and specified peak deciding section 10. The abnormal peak deciding section 9 makes a decision as to whether the peaks output from the peak detecting section 8 include a peak greater than a prestored threshold (referred to as "abnormal peak decision threshold" from now on), and outputs the decision result to the broadcast wave deciding section 12. FIG. 3 is a diagram showing a decision processing method in the abnormal peak deciding section 9. If there is a peak greater than the abnormal peak decision threshold in the peaks output from the peak detecting section 8, the abnormal peak deciding section 9 outputs the abnormal peak existence signal. In contrast, unless there is a peak greater than the abnormal peak decision threshold in the peaks output from the peak detecting section 8, the abnormal peak deciding section 9 outputs the abnormal peak nonexistence signal.

Figure 4:
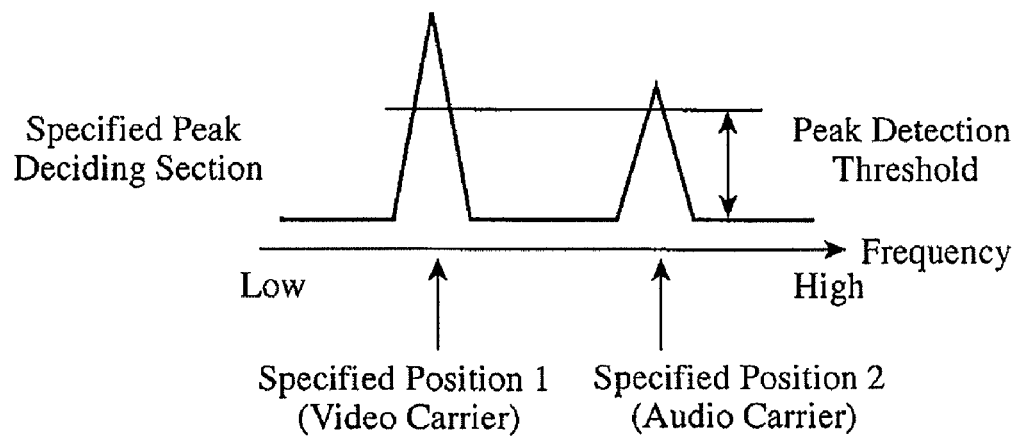
FIG. 4 is a diagram showing a decision processing method in a specified peak deciding section.

The specified peak deciding section 10 makes a decision in a specified frequency band as to whether the peaks output from the peak detecting section 8 include a peak greater than a prestored threshold (referred to as "peak detection threshold" from now on), and outputs the decision result to the broadcast wave deciding section 12. Here, the term "specified frequency band" refers to a frequency band including the video carrier and audio carrier of the analog broadcasting signal. FIG. 4 is a diagram showing a decision processing method in the specified peak deciding section 10. If there is a peak greater than the peak detection threshold in the frequency band of the video carrier or in the frequency band of the audio carrier of the analog broadcasting signal, a specified peak existence signal is output. In contrast, if there is not any peak greater than the peak detection threshold in the frequency band of the video carrier or in the frequency band of the audio carrier of the analog broadcasting signal, a specified peak nonexistence signal is output.

Figure 5:
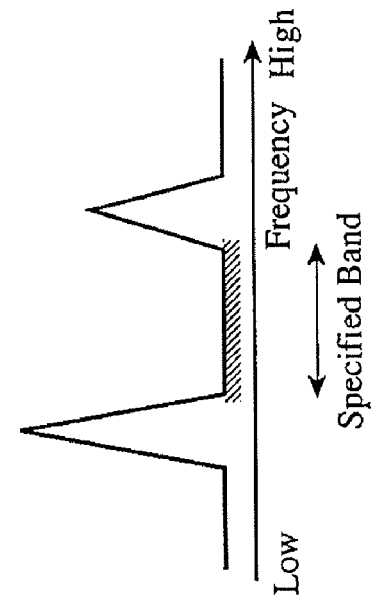
FIG. 5 is a diagram showing a decision processing method in an prescribed in-band power deciding section.
Figure 5:
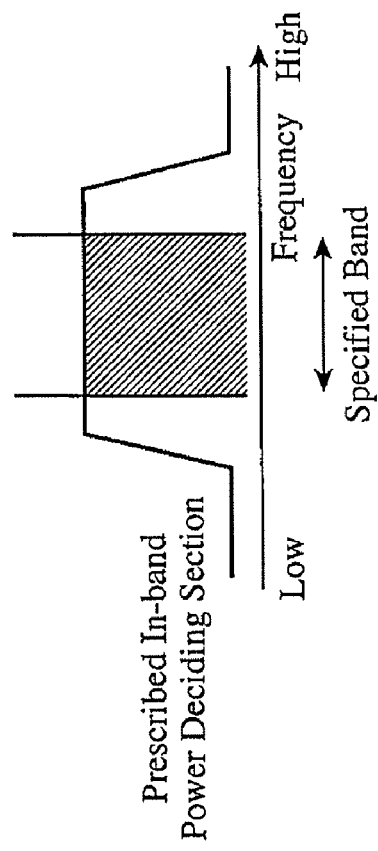

The prescribed in-band power deciding section 11 makes a decision as to whether the sum total of all the powers within a prescribed band is greater than a prestored threshold (referred to as "prescribed in-band power threshold" from now on), and outputs the decision result to the broadcast wave deciding section 12. Here, the term "prescribed band" refers to a frequency band that is sandwiched between the video carrier and audio carrier of the analog broadcasting signal, and does not include either the video carrier or audio carrier. FIG. 5 is a diagram showing a decision processing method in the prescribed in-band power deciding section 11. As shown in FIG. 5($a$), in the case of the digital broadcasting signal, since the sum total of all the powers in the prescribed in-band (shaded area) becomes greater than the prescribed in-band power threshold, the prescribed in-band power deciding section 11 outputs the prescribed in-band power existence signal. In contrast, as shown in FIG. 5($b$), in the case of the analog broadcasting signal, since no power is present between the video carrier and audio carrier, the sum total of the powers (shaded area) in the prescribed in-band does not exceed the prescribed in-band power threshold. Thus, the prescribed in-band power deciding section 11 outputs the prescribed in-band power nonexistence signal.

The broadcast wave deciding section 12 has the timer 14 for measuring a fixed time period and the channel storage section 13 for storing the broadcasting station information output from the MPEG decoder 5; makes a decision as to whether the signal being received is a digital broadcasting signal or not according to the decision result output from the signal level detecting circuit 6, the decision result output from the abnormal peak deciding section 9, the decision result output from the specified peak deciding section 10, and the decision result output from the prescribed in-band power deciding section 11; instructs the tuner 2 to perform tuning according to the decision result; and stores the broadcasting station information output from the MPEG decoder 5 in the channel storage section 13.

Next, the operation will be described.

Figure 6:
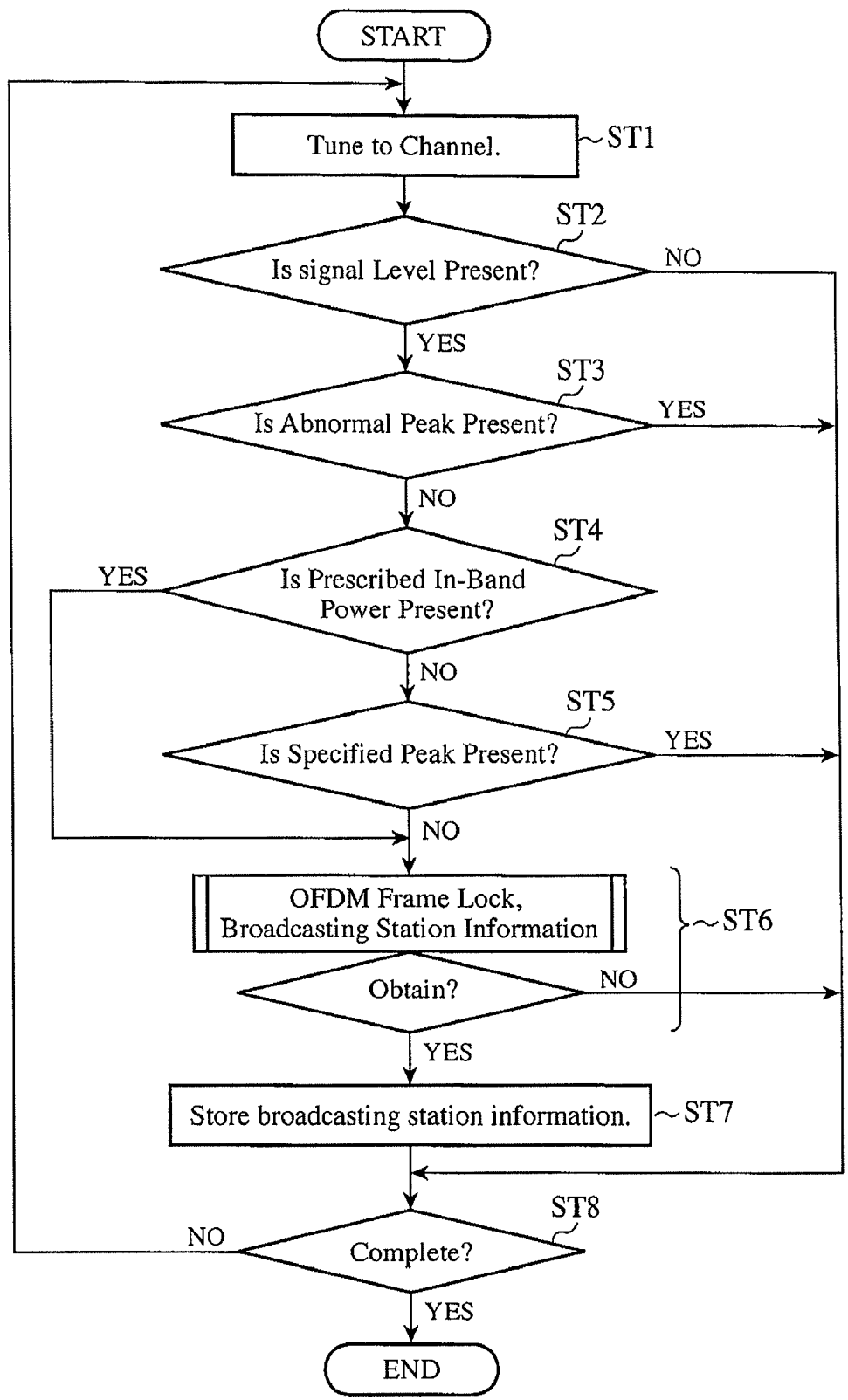
FIG. 6 is a flowchart showing the operation of the digital broadcasting receiving apparatus of the embodiment 1.

FIG. 6 is a flowchart showing the operation of the digital broadcasting receiving apparatus of the embodiment 1. When the search operation is started, the broadcast wave deciding section 12 instructs the tuner 2 to tune to a channel (step ST1). Next, the broadcast wave deciding section 12 makes a decision as to whether the level existence signal is output from the signal level detecting circuit 6 or not (step ST2). If the level existence signal is output from the signal level detecting circuit 6 step ST2, the broadcast wave deciding section 12 makes a decision as to whether the abnormal peak existence signal is output from the abnormal peak deciding section 9 or not (step ST3). If the abnormal peak nonexistence signal is output from the abnormal peak deciding section 9 at step ST3, the broadcast wave deciding section 12 makes a decision as to whether the prescribed in-band power existence signal is output from the prescribed in-band power deciding section 11 or not (step ST4).

If the prescribed in-band power nonexistence signal is output from the prescribed in-band power deciding section 11 at step ST4, the broadcast wave deciding section 12 makes a decision as to whether the specified peak existence signal is output from the specified peak deciding section 10 or not (step ST5). If the prescribed in-band power existence signal is output from the prescribed in-band power deciding section 11 at step ST4, or if the specified peak nonexistence signal is output from the specified peak deciding section 10 at step ST5, the broadcast wave deciding section 12 starts the timer 14, and makes a decision as to whether the OFDM frame lock signal from the OFDM demodulating section 4 and the broadcasting station information from the MPEG decoder 5 are obtained within the fixed time period (step ST6). If the OFDM frame lock signal from the OFDM demodulating section 4 and the broadcasting station information from the MPEG decoder 5 are obtained within the fixed time period at step ST6, the broadcast wave deciding section 12 stores the obtained broadcasting station information in the channel storage section 13 (step ST7).

Next, the broadcast wave deciding section 12 makes a decision as to whether all the frequency bands from channel 13 to channel 62 assigned to the digital broadcasting have been swept (step ST8). In addition, if the level nonexistence signal is output from the signal level detecting circuit 6 at step ST2, or if the abnormal peak existence signal is output from the abnormal peak deciding section 9 at step ST3, or if the specified peak existence signal is output from the specified peak deciding section 10 at step ST5, the broadcast wave deciding section 12 decides that the received signal is not the digital broadcasting signal, and makes a decision as to whether all the frequency bands have been swept (step ST8).

Unless all the frequency bands have been swept at step ST8, the broadcast wave deciding section 12 returns to step ST1, instructs the tuner 2 to tune to the next channel, and carries out the operation from step ST1 to step ST7. In contrast, when all the frequency bands have been swept at step ST8, the broadcast wave deciding section 12 closes the search operation.

As described above, the digital broadcasting receiving apparatus of the present embodiment 1 is configured in such a manner as to carry out the search operation according to the results output from the signal level detecting circuit 6, abnormal peak deciding section 9, specified peak deciding section 10, and prescribed in-band power deciding section 11. Accordingly, it has an advantage of being able to distinguish the digital broadcasting signal from the other signals accurately in a short time, and to perform the search operation quickly. In addition, it is configured in such a manner as to make a decision on whether the signal being received is a digital broadcasting signal or not according to the decision results output successively from the signal level detecting circuit 6, abnormal peak deciding section 9, prescribed in-band power deciding section 11, and specified peak deciding section 10. Thus, it offers an advantage of being able to decide as to whether the signal being received is the digital broadcasting signal or not efficiently and quickly.

Furthermore, it has an advantage of being able to obviate the need for providing a dedicated tuner or the like for detecting the analog broadcasting signal, and hence to prevent the apparatus from becoming larger. Additionally, since the prescribed in-band power deciding section 11 makes a decision of the digital broadcasting signal depending on whether the sum total of all the powers of the prescribed in-band is greater than the prescribed band power threshold or not, it offers an advantage of being able to prevent noise produced from devices used simultaneously from being erroneously detected as the digital broadcasting signal.

Incidentally, although the present embodiment 1 is configured in such a manner that the digital signal output from the AD converter 3 undergoes the FFT processing by the FFT analyzing section 7, and its result is output to the peak detecting section 8 and prescribed in-band power deciding section 11, a configuration is also possible in which the digital signal output from the AD converter 3 undergoes the FFT processing by the OFDM demodulating section 4, and its result is output to the peak detecting section 8 and prescribed in-band power deciding section 11. Such a configuration can obviate the need for providing the FFT analyzing section 7, and offers an advantage of being able to reduce the circuit scale. In addition, although the frequency resolution reduces, it is also possible to apply the FFT processing only to part of OFDM symbols contained in the digital signal output from the AD converter 3 and to output the result. Such a configuration offers an advantage of being able to make a decision as to whether the signal is a digital broadcasting signal or not more quickly.

INDUSTRIAL APPLICABILITY

As described above, the digital broadcasting receiving apparatus in accordance with the present invention can distinguish the digital broadcasting signal from the other signals accurately in a short time, and can carry out the search operation at high speed. Accordingly, it is suitable for onboard devices.

What is claimed is:

1. A digital broadcasting receiving apparatus which receives digital broadcasting, comprising:

a signal level detecting circuit configured to perform gain control to maintain a power level of a received signal at a fixed level, to decide whether an automatic gain control level of the gain control is greater than a prestored signal level threshold, and to output a result of the signal level detecting circuit decision;

a peak detecting section configured to detect a peak of a power level within a frequency band of the received signal, and to output the detected peak;

an abnormal peak deciding section configured to decide whether there is a peak greater than a prestored abnormal peak decision threshold in the peak output from the peak detecting section, and to output a result of the abnormal peak deciding section decision;

a specified peak deciding section configured to decide, within a specified frequency band whether there is a peak exceeding a prestored peak detection threshold in the peak output from the peak detecting section, and to output a result of the specified peak deciding section decision;

a prescribed in-band power deciding section configured to decide whether a sum total of all powers within a prescribed band is greater than a prestored prescribed in-band power threshold, and to output a result of the prescribed in-band power deciding section decision; and a broadcast wave deciding section configured to decide that there is a digital broadcasting signal on condition that:

the signal level detecting circuit decides that there is a signal, the abnormal peak deciding section decides that there is not an abnormal peak, the prescribed in-band power deciding section decides that there is a prescribed in-band power, and the broadcast wave deciding section obtains an OFDM frame lock signal and a broadcasting station information within a fixed time period; or the signal level detecting circuit decides that there is a signal, the abnormal peak deciding section decides that there is not an abnormal peak, the prescribed in-band power deciding section decides that there is not a prescribed in-band power, the specified peak deciding section decides that there is not a specified peak, and the broadcast wave deciding section obtains an OFDM frame lock signal and a broadcasting station information within a fixed time period.

2. The digital broadcasting receiving apparatus according to claim 1, wherein the broadcast wave deciding section makes the decision as to whether the received signal is the digital broadcasting signal according to the decision results output in order from the signal level detecting circuit, the abnormal peak deciding section, the prescribed in-band power deciding section, and the specified peak deciding section.

3. The digital broadcasting receiving apparatus according to claim 1, wherein the specified peak deciding section makes the decision as to whether there is the peak greater than the prestored peak detection threshold within the frequency band which is a frequency band of a video carrier or a frequency band of an audio carrier of an analog broadcasting signal.

4. The digital broadcasting receiving apparatus according to claim 1, wherein the prescribed in-band power deciding section makes the decision as to whether the sum total of all the powers, is greater than the prestored prescribed in-band power threshold within the frequency band which is a frequency band being sandwiched between a video carrier and an audio carrier of an analog broadcasting signal and not including either the video carrier or the audio carrier.

* * * * *